US007807321B2

(12) United States Patent
Step et al.

(10) Patent No.: US 7,807,321 B2
(45) Date of Patent: Oct. 5, 2010

(54) HIGH RESISTIVITY COMPOSITIONS

(75) Inventors: Eugene N. Step, Newton, MA (US); Agathagelos Kyrlidis, Malden, MA (US)

(73) Assignee: Cabot Corporation, Boston, MA (US)

(*) Notice: Subject to any disclaimer, the term of this patent is extended or adjusted under 35 U.S.C. 154(b) by 1220 days.

(21) Appl. No.: 11/251,028

(22) Filed: Oct. 14, 2005

(65) Prior Publication Data

US 2006/0084751 A1  Apr. 20, 2006

Related U.S. Application Data

(60) Provisional application No. 60/619,317, filed on Oct. 15, 2004, provisional application No. 60/645,972, filed on Jan. 11, 2005, provisional application No. 60/698,204, filed on Jul. 7, 2005, provisional application No. 60/708,000, filed on Aug. 12, 2005, provisional application No. 60/715,877, filed on Sep. 9, 2005.

(51) Int. Cl.
G03F 1/00 (2006.01)
(52) U.S. Cl. .......................................... 430/7; 523/210
(58) Field of Classification Search .................... 430/7; 523/210
See application file for complete search history.

(56) References Cited

U.S. PATENT DOCUMENTS

| 2,867,540 | A | 1/1959 | Harris |
| 3,335,020 | A | 8/1967 | Aboytes et al. |
| 3,479,300 | A | 11/1969 | Rivin et al. |
| 4,014,844 | A | 3/1977 | Vidal et al. |
| 4,871,371 | A | 10/1989 | Harris |
| 4,909,852 | A | 3/1990 | Atkinson |
| 5,281,261 | A | 1/1994 | Lin |
| 5,418,277 | A | 5/1995 | Ma et al. |
| 5,545,504 | A | 8/1996 | Keoshkerian et al. |
| 5,554,739 | A | 9/1996 | Belmont |
| 5,571,311 | A | 11/1996 | Belmont et al. |
| 5,630,868 | A | 5/1997 | Belmont et al. |
| 5,672,198 | A | 9/1997 | Belmont |
| 5,698,016 | A | 12/1997 | Adams et al. |
| 5,707,432 | A | 1/1998 | Adams et al. |
| 5,708,055 | A | 1/1998 | Joyce et al. |
| 5,713,988 | A | 2/1998 | Belmont et al. |
| 5,714,993 | A | 2/1998 | Keoshkerian et al. |
| 5,716,435 | A | 2/1998 | Aida et al. |
| 5,747,562 | A | 5/1998 | Mahmud et al. |
| 5,749,950 | A | 5/1998 | Mahmud et al. |
| 5,766,268 | A | 6/1998 | Bruhnke |
| 5,800,928 | A | 9/1998 | Fischer et al. |
| 5,803,959 | A | 9/1998 | Johnson et al. |
| 5,830,265 | A | 11/1998 | Tsang et al. |
| 5,837,045 | A | 11/1998 | Johnson et al. |
| 5,851,280 | A | 12/1998 | Belmont et al. |
| 5,885,335 | A | 3/1999 | Adams et al. |
| 5,895,522 | A | 4/1999 | Belmont et al. |
| 5,900,029 | A | 5/1999 | Belmont et al. |
| 5,914,806 | A | 6/1999 | Gordon, II et al. |
| 5,919,846 | A | 7/1999 | Batlaw et al. |
| 5,922,118 | A | 7/1999 | Johnson et al. |
| 5,952,429 | A | 9/1999 | Ikeda et al. |
| 5,964,935 | A | 10/1999 | Chen et al. |
| 5,968,243 | A | 10/1999 | Belmont et al. |
| 5,976,233 | A | 11/1999 | Osumi et al. |
| 5,985,016 | A | 11/1999 | Tsang et al. |
| 6,042,643 | A | 3/2000 | Belmont et al. |
| 6,068,688 | A | 5/2000 | Whitehouse et al. |
| 6,069,190 | A | 5/2000 | Bates et al. |
| 6,103,380 | A | 8/2000 | Devonport |
| 6,110,994 | A | 8/2000 | Cooke et al. |
| 6,150,433 | A | 11/2000 | Tsang et al. |
| 6,221,143 | B1 | 4/2001 | Palumbo |
| 6,221,932 | B1 | 4/2001 | Moffatt et al. |
| 6,235,829 | B1 | 5/2001 | Kwan |
| 6,277,183 | B1 | 8/2001 | Johnson et al. |
| 6,328,894 | B1 | 12/2001 | Chan et al. |
| 6,336,965 | B1 | 1/2002 | Johnson et al. |

(Continued)

FOREIGN PATENT DOCUMENTS

EP  0 677 556 A2  10/1995

(Continued)

OTHER PUBLICATIONS

English Abstract of JP 57-21466, published Feb. 1982.

(Continued)

*Primary Examiner*—Edward J Cain

(57) ABSTRACT

The present invention relates to a black matrix formed by applying a curable coating composition onto a substrate to form a curable coating, curing the curable coating imagewise to form a coating, and developing and drying the coating. The curable coating composition comprises a vehicle, a curable resin, and at least one modified pigment comprising a pigment having attached at least one organic group having the formula —X—I or —X—NI, wherein X, which is directly attached to the pigment, represents an arylene or heteroarylene group, an alkylene group, an aralkylene group, or an alkarylene group, I represents a non-polymeric group comprising at least one ionic group or at least one ionizable group, and NI represents a non-polymeric group comprising at least one nonionic group. The curable coating composition, curable coating, and cured coating are also described. Also disclosed is a method of controlling the resistivity of a coating.

24 Claims, 4 Drawing Sheets

U.S. PATENT DOCUMENTS

| | | | |
|---|---|---|---|
| 6,337,358 | B1 | 1/2002 | Whitehouse et al. |
| 6,350,519 | B1 | 2/2002 | Devonport |
| 6,368,239 | B1 | 4/2002 | Devonport |
| 6,372,820 | B1 | 4/2002 | Devonport |
| 6,432,194 | B2 | 8/2002 | Johnson et al. |
| 6,458,458 | B1 | 10/2002 | Cooke et al. |
| 6,472,471 | B2 | 10/2002 | Cooke et al. |
| 6,479,571 | B1 | 11/2002 | Cooke et al. |
| 6,780,389 | B2 | 8/2004 | Karl et al. |
| 6,929,889 | B2 | 8/2005 | Belmont |
| 6,960,250 | B2 | 11/2005 | Luethge et al. |
| 7,175,946 | B2 | 2/2007 | Step |
| 2002/0011185 | A1* | 1/2002 | Belmont .................. 106/410 |
| 2002/0020318 | A1 | 2/2002 | Galloway et al. |
| 2002/0187412 | A1 | 12/2002 | You et al. |
| 2003/0129529 | A1 | 7/2003 | Step et al. |
| 2005/0175930 | A1* | 8/2005 | Lee ....................... 430/270.1 |

FOREIGN PATENT DOCUMENTS

| | | |
|---|---|---|
| WO | WO 99/31175 | 6/1999 |
| WO | WO 99/38921 | 8/1999 |
| WO | WO 99/51690 | 10/1999 |
| WO | WO 00/43446 | 7/2000 |
| WO | WO 00/52102 | 9/2000 |
| WO | WO 01/25340 | 4/2001 |

OTHER PUBLICATIONS

English Abstract of JP 01-113472, published May 1989.
English Abstract of JP 06-128517, published May 1994.
English Abstract of JP 09-022653, published Jan. 21, 1997.
English Abstract of JP 10-010311, published Jan. 16, 1998.
English Abstract of JP 10-253820, published Sep. 25, 1998.
English Abstract of JP 11-060989, published Mar. 5, 1999.
English Abstract of JP 11080636 A, published Mar. 26, 1999.
English Abstract of JP 11-246806 A, published Sep. 14, 1999.
English Abstract of JP 11-256066 A, published Sep. 21, 1999.
English Abstract of JP 2004-004762, published Jan. 8, 2004.
English Abstract of JP 2004-029745, published Jan. 29, 2004.
English Abstract of JP 2004-075985, published Mar. 11, 2004.
English Abstract of JP 2004-198717, published Jul. 15, 2004.
English Abstract of JP 2004-251946, published Sep. 9, 2004.
English Abstract of JP 2004-292672, published Oct. 21, 2004.
English Abstract of KR2003-057090, published Jul. 4, 2003.

* cited by examiner

HIGH RESISTIVITY COMPOSITIONS

CROSS-REFERENCE TO RELATED APPLICATIONS

This patent application claims the benefit of U.S. Provisional Patent Application Nos. 60/619,317, filed Oct. 15, 2004, 60/645,972, filed Jan. 11, 2005, 60/698,204, filed Jul. 7, 2005, 60/708,000, filed Aug. 12, 2005, and 60/715,877, filed Sep. 9, 2005.

BACKGROUND OF THE INVENTION

1. Field of the Invention

The present invention relates to black matrixes prepared from a curable coating composition. The present invention also relates to the curable coating composition, to curable coatings prepared from the curable coating composition, and coatings prepared by curing the curable coatings. The present invention further relates to methods of preparing curable coatings having preselected electrical properties.

2. Description of the Related Art

Black matrix is a generic name for materials used in color displays to improve the contrast of an image by separating individual color pixels. In liquid crystal displays (LCDs), the black matrix is a thin film having high light-shielding capability and is formed between the three color elements of a color filter. In LCD's using thin film transistors (TFT), the black matrix also prevents the formation of photo-induced currents due to reflected light in the TFT.

The black matrix layer in liquid crystal displays has been manufactured by vapor deposition of Cr/CrO. Although chromium based films have excellent light-shielding capabilities, the metal vapor deposition process is expensive. In addition, chromium use and disposal is subject to increasingly restrictive environmental regulations. Chromium films also have low resistivity, which restricts the electrical design of LCDs to a subset of the possible design configurations.

Black pigments such as carbon black have been used in polymer compositions to make resistive black matrixes. However, typical systems have not been able to provide the desired balance of overall properties. For example, while a black matrix containing a carbon black pigment could provide the required light-shielding capabilities (that is, an optical density (OD) of greater than 3 at 1 micron thickness), typically the film would have only a modest resistivity. Alternatively, if a highly resistive film were produced, the OD would typically be low.

Modified pigments having attached organic groups have also been disclosed for use in a black matrix for color filters. For example, U.S. Patent Publication No. 2003-0129529 A1 discloses, in part, a black matrix prepared using a modified pigment comprising a pigment having attached at least one polymeric group, wherein the polymeric group comprises at least one photopolymerizable group and at least one ionic or ionizable group. Also, U.S. Patent Publication No. 2002-0020318 A1 discloses, in part, a black matrix prepared using a modified pigment comprising a pigment having attached at least one organic ionic group and at least one amphiphilic counterion. In addition, U.S. Patent Publication No. 2002-0011185 A1 discloses, in part, the use of a modified pigment comprising a pigment having attached at least one alkylene or alkyl group having 50-200 carbons. While these materials provide black matrixes and dispersions with good overall performance, there remains a need for black matrixes with improved properties, in particular, resistivity and optical density.

SUMMARY OF THE INVENTION

The present invention relates to a black matrix comprising at least one modified pigment, wherein the modified pigment comprises a pigment having attached at least one organic group having the formula —X—I or —X—NI, wherein X, which is directly attached to the pigment, represents an arylene or heteroarylene group, an alkylene group, an aralkylene group, or an alkarylene group, I represents a non-polymeric group comprising at least one ionic group or at least one ionizable group, and NI represents a non-polymeric group comprising at least one nonionic group. Preferably, the black matrix is formed by applying a curable coating composition onto a substrate to form a curable coating, curing the curable coating imagewise to form a coating, and developing and drying the coating. The curable coating composition comprises a vehicle and the modified pigment.

The present invention further relates to a curable coating composition comprising a vehicle, a curable resin and at least one modified pigment, wherein the modified pigment comprises a pigment having attached at least one organic group having the formula —X—I or —X—NI, wherein X, which is directly attached to the pigment, represents an arylene or heteroarylene group, an alkylene group, an aralkylene group, or an alkarylene group, I represents a non-polymeric group comprising at least one ionic group or at least one ionizable group, and NI represents a non-polymeric group comprising at least one nonionic group. The modified pigment is present in an amount such that, when the curable coating composition is applied to a substrate to form a curable coating and cured to form a coating, the coating comprises greater than or equal to about 30 wt % of the modified pigment based on the total weight of the coating.

The present invention further relates to a curable coating comprising a curable resin and at least one modified pigment, wherein the modified pigment comprises a pigment having attached at least one organic group having the formula —X—I or —X—NI, wherein X, which is directly attached to the pigment, represents an arylene or heteroarylene group, an alkylene group, an aralkylene group, or an alkarylene group, I represents a non-polymeric group comprising at least one ionic group or at least one ionizable group, and NI represents a non-polymeric group comprising at least one nonionic group. The modified pigment is present in an amount such that, when the curable coating is cured to form a coating, the coating comprises greater than or equal to about 30 wt % of the modified pigment based on the total weight of the coating.

The present invention further relates to a black matrix formed by applying a curable coating composition onto a substrate to form a curable coating, curing the curable coating imagewise to form a coating, and developing and drying the coating. The curable coating composition comprises a vehicle and at least one modified pigment, wherein the modified pigment comprises the reaction product of a pigment, such as carbon black, and a persulfate reagent. The present invention further relates to a curable coating composition comprising a curable resin and this modified pigment, wherein the modified pigment is present in an amount such that, when the curable coating composition is applied to a substrate to form a curable coating and cured to form a coating, the coating comprises greater than or equal to about 30 wt % of the modified pigment based on the weight of the coating. The present invention further relates to a curable coating comprising a curable resin and this modified pigment, wherein the modified pigment is present in an amount such that, when the curable coating is cured to form a coating, the coating comprises greater than or equal to about 30 wt % of the modified pigment based on the total weight of the coating.

The present invention further relates to a coating comprising a resin and at least one modified pigment. In one embodiment, the modified pigment of the coating comprises a pigment having attached at least one organic group having the formula —X—I or —X—NI, wherein X, which is directly attached to the pigment, represents an arylene or heteroarylene group, an alkylene group, an aralkylene group, or an alkarylene group, I represents a non-polymeric group comprising at least one ionic group or at least one ionizable group, and NI represent a non-polymeric group comprising at least one nonionic group. In another embodiment, the coating comprises a resin and at least one modified pigment and has a volume resistivity of greater than or equal to $10^{12}$ ohm-cm and an optical density of greater than or equal to 3 at a 1 micron thickness. In a third embodiment, the coating comprises a resin and at least one modified pigment and has a volume resistivity of between $10^6$ and $10^8$ ohm-cm and an optical density of greater than or equal to 4 at a 1 micron thickness. In a fourth embodiment, the coating comprises a resin and at least one modified pigment, wherein the modified pigment is the reaction product of a pigment, such as carbon black, and a persulfate reagent. For each of these embodiments, the coating comprises greater than or equal to about 30 wt % of the modified pigment based on the total weight of the coating.

The present invention further relates to a method of controlling the resistivity of a coating comprising a resin and a pigment. The method comprises the step of preparing a curable coating composition comprising a vehicle, a curable resin, and at least one modified pigment. The modified pigment comprises the pigment having attached at least one organic group having the formula —X—I or —X—NI, wherein X, which is directly attached to the pigment, represents an arylene or heteroarylene group, an alkylene group, an aralkylene group, or an alkarylene group, I represents a non-polymeric group comprising at least one ionic group or at least one ionizable group, and NI represent a non-polymeric group comprising at least one nonionic group. The curable coating composition can then be applied to a substrate to form a curable coating and cured to form the coating.

The present invention further relates to a coating having a preselected resistivity at a preselected pigment loading level comprising a resin and a modified pigment. The modified pigment comprises a pigment having attached at least one organic group having the formula —X—I or —X—NI, wherein X, which is directly attached to the pigment, represents an arylene or heteroarylene group, an alkylene group, an aralkylene group, or an alkarylene group, I represents a non-polymeric group comprising at least one ionic group or at least one ionizable group, and NI represent a non-polymeric group comprising at least one nonionic group. A coating comprising the resin and said pigment has a resistivity at the preselected pigment loading level that is lower than the resistivity of the coating comprising the resin and the modified pigment at said preselected pigment loading level.

It is to be understood that both the foregoing general description and the following detailed description are exemplary and explanatory only and are intended to provide further explanation of the present invention, as claimed.

BRIEF DESCRIPTION OF THE DRAWINGS

FIG. 2 and FIG. 3 show the effect of treatment level and FIG. 4 shows the effect of attachment level.

DETAILED DESCRIPTION OF THE INVENTION

Figure 1:
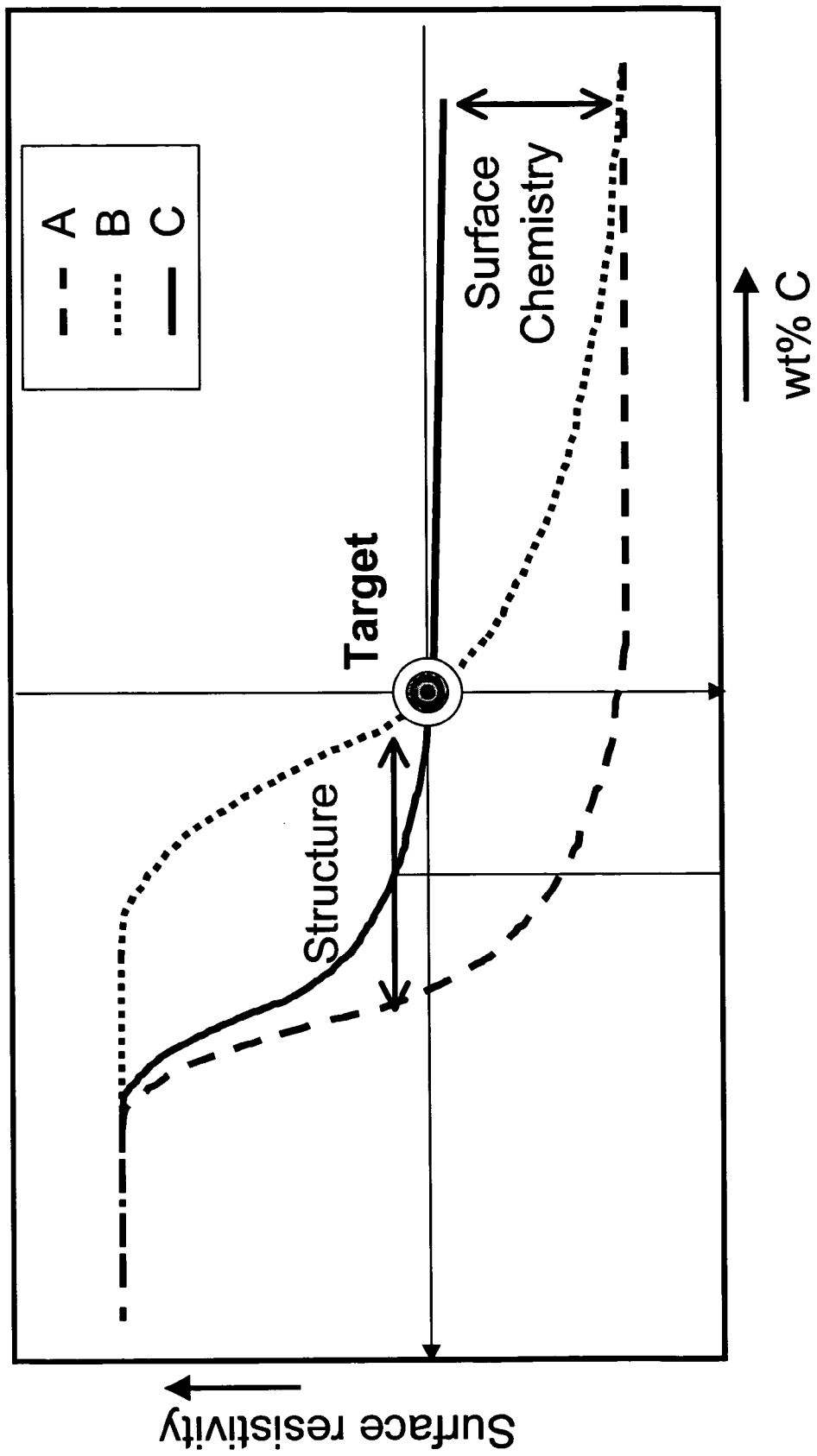
FIG. 1 is a graph which shows the surface resistivity of coatings and how surface chemistry can be used for resistivity control.

The present invention relates to curable coating compositions, curable coatings, and coatings comprising modified pigments, and black matrixes that can be formed therefrom.

The present invention relates to a curable coating composition, which, in one embodiment may be used to prepare the black matrix of the present invention, described in more detail below. The curable coating composition comprises a vehicle, a curable resin, and at least one modified pigment. The vehicle may be either an aqueous vehicle or a non-aqueous vehicle. While both aqueous and non-aqueous liquid vehicles can be used, preferably the liquid vehicle is a non-aqueous vehicle. Examples include non-aqueous vehicles comprising butyl acetate, ethylcellosolve, ethylcellosolve acetate, butylcellosolve, butylcellosolve acetate, ethylcarbitol, ethylcarbitol acetate, diethyleneglycol, cyclohexanone, propyleneglycol monomethylether, propyleneglycol monomethylether acetate, lactate esters, dimethyl formamide, methyl ethyl ketone, dimethylacetamide, and mixtures thereof. Aqueous solvents may also be added, including, for example, water and water soluble alcohols.

The curable resin may be any resin known in the art. For example, the resin may be an epoxy bisphenol-A resin or an epoxy novolac resin. The resin may also be an acrylic resin, a polyimide resin, a urethane resin, a polyester resin, or a gelatin. The resin is one that may be cured by a variety of known methods, including, for example, thermally or by any source of radiation such as, for example, infrared or ultraviolet radiation. In this way, the curable coating composition may be photosensitive (i.e. may be cured by irradiation) or thermosensitive (i.e., may be cured by changing temperature, such as by heating). When the resin is curable by irradiation, the curable coating composition may further comprise a photoinitiator, which generates a radical on absorbing light with the respective pigment.

The modified pigment used in the curable coating composition of the present invention comprises a pigment having attached at least one organic group. The pigment can be any type of pigment conventionally used by those skilled in the art, such as black pigments and other colored pigments including blue, black, brown, cyan, green, white, violet, magenta, red, orange, or yellow pigments. Mixtures of different pigments can also be used. Representative examples of black pigments include various carbon blacks (Pigment Black 7) such as channel blacks, furnace blacks and lamp blacks, and include, for example, carbon blacks sold under the Regal®, Black Pearls®, Elftex®, Monarch®, Mogul®, and Vulcan® trademarks available from Cabot Corporation (such as Black Pearls® 2000, Black Pearls® 1400, Black Pearls® 1300, Black Pearls® 1100, Black Pearls® 1000, Black Pearls® 900, Black Pearls® 880, Black Pearls® 800, Black Pearls® 700, Black Pearls® L, Elftex® 8, Monarch® 1400, Monarch® 1300, Monarch® 1100, Monarch® 1000, Monarch® 900, Monarch® 880, Monarch® 800, Monarch® 700, Mogul® L, Mogul® E, Regal® 250, Regal® 250R, Regal® 350, Regal® 350R, Regal® 330, Regal® 400, Vulcan® P, Vulcan® XC-72, Vulcan® XC-72R). Suitable classes of colored pigments include, for example, anthraquinones, phthalocyanine blues, phthalocyanine greens, diazos, monoazos, pyranthrones, perylenes, heterocyclic yellows, quinacridones, and (thio)indigoids. Such pigments are commercially available in either powder or press cake form from a number of sources including, BASF Corporation, Engelhard Corporation and Sun Chemical Corporation. Examples of other suitable colored pigments are described in the Colour Index, 3rd edition (The Society of Dyers and Colourists, 1982). Preferably the pigment is a carbon product, such as carbon black. These pigments can also be used in combination with a variety of different types of dispersants in order to form stable dispersions.

The pigment may also be a multiphase aggregate comprising a carbon phase and a silicon-containing species phase or a multiphase aggregate comprising a carbon phase and a metal-containing species phase. The multiphase aggregate containing the carbon phase and the silicon-containing species phase can also be considered a silicon-treated carbon black aggregate and the multiphase aggregate containing a carbon phase and a metal-containing species phase can be considered to be a metal-treated carbon black aggregate as long as one realizes that in either case, the silicon-containing species and/or metal-containing species are a phase of the aggregate just like the carbon phase. The multiphase aggregates do not represent a mixture of discrete carbon black aggregates and discrete silica or metal aggregates and are not silica coated carbon blacks. Rather, the multiphase aggregates that can be used as the pigment in the present invention include at least one silicon-containing or metal-containing region concentrated at or near the surface of the aggregate (but put of the aggregate) and/or within the aggregate. The aggregate, thus contains at least two phases, one of which is carbon and the other of which is a silicon-containing species, a metal-containing species, or both. The silicon-containing species that can be a part of the aggregate is not attached to a carbon black aggregate like a silica coupling agent, but actually is part of the same aggregate as the carbon phase.

The metal-treated carbon blacks are aggregates containing at least a carbon phase and a metal-containing species phase. The metal-containing species include compounds containing aluminum, zinc, magnesium, calcium, titanium, vanadium, cobalt, nickel, zirconium, tin, antimony, chromium, neodymium, lead, tellurium, barium, cesium, iron, silver, copper, and molybdenum. The metal-containing species phase can be distributed through at least a portion of the aggregate and is an intrinsic part of the aggregate. The metal-treated carbon black may also contain more than one type of metal-containing species phase or the metal-treated carbon black can also contain a silicon-containing species phase and/or a boron-containing species phase.

The details of making these multiphase aggregates are explained in U.S. patent application Ser. Nos. 08/446,141, filed May 22, 1995; 08/446,142, filed May 22, 1995; 08/528,895, filed Sep. 15, 1995; 08/750,017, filed Nov. 22, 1996, which is a National Phase Application of PCT No. WO 96/37547, filed May 21, 1996; 08/828,785, filed Mar. 27, 1997; 08/837,493 filed Apr. 18, 1997; and 09/061,871 filed Apr. 17, 1998. All of these patent applications are hereby incorporated in their entireties herein by reference.

A silica-coated carbon product can also be used as the particle, such as that described in PCT Application No. WO 96/37547, published Nov. 28, 1996. which is hereby incorporated in its entirety herein by reference.

The pigment can have a wide range of BET surface areas, as measured by nitrogen adsorption, depending on the desired properties of the pigment. For example, the pigment may be a carbon black having a surface area of from about 10 to 600 $m^2/g$, such as from about 20 to 250 $m^2/g$ and about 20 to 100 $m^2/g$. As known to those skilled in the art, a higher the surface area will correspond to smaller primary particle size. The pigment can also have a wide variety of primary particle sizes known in the art. For example, the pigment may have a primary particle size of between about 5 nm to about 100 nm, including about 10 nm to about 80 nm and 15 nm to about 50 nm. If, for example, a higher surface area for a colored pigment is not readily available for the desired application, it is also well recognized by those skilled in the art that the pigment may be subjected to conventional size reduction or comminution techniques, such as ball or jet milling, to reduce the pigment to a smaller particle size, if desired.

The pigment can also have a wide range of dibutylphthalate absorption (DBP) values, which is a measure of the structure or branching of the pigment. For example, the pigment may be a carbon black having a DBP value of from about 25 to 70 mL/100 g, including from about 30 to 50 mL/100 g and from about 30 to 40 mL/100 g. In addition, the pigment may have a wide range of primary particle sizes, such as from about 10 to 100 nm, including from about 15 to 60 nm. The preferred pigments approach an essentially overall spherical geometry. Pigments with other shapes, such as needles and plates, may also be used.

The modified pigment has attached at least one organic group. In one embodiment, the organic group has the formula —X—I. In another embodiment, the organic group has the formula —X—NI. The modified pigment may also comprise at least one organic group having the formula —X—I and at least one organic group having the formula —X—NI. Each of these groups will be described in more detail below. The modified pigments may be prepared using methods known to those skilled in the art such that organic chemical groups are attached to the pigment. This provides a more stable attachment of the groups onto the pigment compared to adsorbed groups, e.g., polymers, surfactants, and the like. For example, the modified pigments can be prepared using the methods described in U.S. Pat. Nos. 5,554,739, 5,707,432, 5,837,045, 5,851,280, 5,885,335, 5,895,522, 5,900,029, 5,922,118, and 6,042,643, and PCT Publication WO 99/23174, the descriptions of which are fully incorporated herein by reference. Such methods provide for a more stable attachment of the groups onto the pigment compared to dispersant type methods, which use, for example, polymers and/or surfactants.

The group X represents an arylene or heteroarylene group, an alkylene group, an aralkylene group, or an alkarylene group. X is directly attached to the pigment and is further substituted with an I group or an NI group. Preferably, X represents an arylene or heteroarylene group, such as a phenylene, naphthylene, or biphenylene. When X represents an alkylene group, examples include, but are not limited to, substituted or unsubstituted alkylene groups that may be branched or unbranched. For example, the alkylene group may be a $C_1$-$C_{12}$ group such as methylene, ethylene, propylene, or butylene, group. Most preferably, X is an arylene group.

The group X can be further substituted with other groups, such as one or more alkyl groups or aryl groups. Also, the group X may be substituted with one or more functional groups. Examples of functional groups include, but are not limited to, R, OR, COR, COOR, OCOR, carboxylates, halogens, CN, $NR_2$, $SO_3H$, sulfonates, sulfates, NR(COR), $CONR_2$, $NO_2$, $PO_3H_2$, phosphonates, phosphates, N=NR, SOR, $NSO_2R$, wherein R, which can be the same or different, is independently hydrogen, branched or unbranched $C_1$-$C_{20}$ substituted or unsubstituted, saturated or unsaturated hydrocarbons, e.g., alkyl, alkenyl, alkynyl, substituted or unsubstituted aryl, substituted or unsubstituted heteroaryl, substituted or unsubstituted alkaryl, or substituted or unsubstituted aralkyl.

The group I represents a group comprising at least one ionic group or at least one ionizable group. The group I may also comprise a mixture of an ionic group and an ionizable group. The ionic group is either anionic or cationic and is associated with a counterion of the opposite charge including counterions such as $Na^+$, $K^+$, $Li^+$, $NH_4^+$, $NR'_4^+$, acetate, $NO_3^-$, $SO_4^{-2}$, $R'SO_3^-$, $R'OSO_3^-$, $OH^-$, and $Cl^-$, where R' represents hydrogen or an organic group such as a substituted or unsubstituted aryl and/or alkyl group. The ionizable group is one that is capable of forming an ionic group in the medium of use. Anionizable groups form anions and cationizable groups form cations. Ionic groups include those described in U.S. Pat. No. 5,698,016, the description of which is fully incorporated herein by reference.

The anionic groups are negatively charged ionic groups that may be generated from groups having ionizable substituents that can form anions (anionizable groups), such as acidic substituents. They may also be the anion in the salts of ionizable substituents. Representative examples of anionic groups include —$COO^-$, —$SO_3^-$, —$OSO_3^-$, —$HPO_3^-$, —$OPO_3^{-2}$, and —$PO_3^{-2}$. Preferably, the anionic group comprises a counterion that is a monovalent metal salt such as a $Na^+$ salt, a $K^+$ salt, a $Li^+$ salt. The counterion may also be an ammonium salt, such as a $NH_4^+$ salt. Representative examples of anionizable groups include —COOH, —$SO_3H$, —$PO_3H_2$, —R'SH, —R'OH, and —$SO_2NHCOR'$, where R' represents hydrogen or an organic group such as a substituted or unsubstituted aryl and/or alkyl group.

The cationic groups are positively charged ionic groups that may be generated from ionizable substituents that can form cations (cationizable groups), such as protonated amines. For example, alkyl or aryl amines may be protonated in acidic media to form ammonium groups —$NR'_2H^+$, where R' represent an organic group such as a substituted or unsubstituted aryl and/or alkyl group. Cationic groups may also be positively charged organic ionic groups. Examples include quaternary ammonium groups (—$NR'_3^+$) and quaternary phosphonium groups (—$PR'_3^+$). Here, R' represents hydrogen or an organic group such as a substituted or unsubstituted aryl and/or alkyl group. Preferably, the cationic group comprises an alkyl amine group or a salt thereof or an alkyl ammonium group.

Preferably, the group I comprises at least one carboxylic acid group or salt thereof, at least one sulfonic acid group or salt thereof, at least one sulfate group, a least one alkyl amine group or salt thereof, or at least one alkyl ammonium group. Since it is preferred that the group X be an arylene group, preferred attached organic groups having the formula —X—I include, but are not limited to, aryl carboxylic acid groups, aryl sulfonic acid groups, or salts thereof. For example, the attached organic group may be a benzene carboxylic acid group, a benzene dicarboxylic acid group, a benzene tricarboxylic acid group, a benzene sulfonic acid group, or salts thereof. The attached organic group may also be a substituted derivative of any of these.

The group NI represents a group comprising at least one nonionic group, which is a group having no apparent charge. Examples of non-ionic groups include, but are not limited to, alkyl groups (such as —R"), carboxylic acid esters (such as —COOR" or —OCR"), amides (such as —CONHR", —CONR"$_2$, —NHCOR", or —NR"COR"), alkylene oxides, glycols, alcohols, ethers (such as —OR"), ketones (such as —COR"), halogens, and nitrites. In the above formulas, R" is a branched or unbranched alkyl or alkylene group having 1-20 carbon atoms. Thus, for example, the group NI attached to X may be a methyl or ethyl ester of a carboxylic acid or may be a non-polymeric group comprising this ester. Since it is preferred that X be an arylene group, preferred attached organic groups having the formula —X—NI include, but are not limited to, aryl carboxylic acid esters, aryl carboxylic acid amides, or aralkyl groups, wherein the ester group, amide group, and alkyl group has 1-20 carbon atoms. For example, the attached organic group may be a methyl or ethyl ester of a benzene carboxylic acid group, a benzene dicarboxylic acid ester group, or a benzene tricarboxylic acid ester group, or may be a methyl or ethyl benzene group.

Surprisingly, it has been found that modified pigments having attached organic groups that do not comprise polymeric groups may be used in the curable coating compositions, curable coatings, and coatings of the present invention. Thus, for the purposes of the present invention, the group I and the group NI are non-polymeric groups, which means that, while the group I comprises at least one ionic or ionizable group and the group NI comprises at least one nonionic group, these groups do not comprise groups prepared by the polymerization of individual monomer units. For example, the group I is not a polymeric group which comprises at least one ionic or ionizable group and the group NI is not a polymeric group which comprises at least one nonionic group. Furthermore, the group I is not an ionic group that comprises a polymeric counterion. These modified pigments have been found to provide several advantages over modified pigments comprising polymeric groups, which are described in more detail below.

The amount of attached organic groups having the formula —X—I or —X—NI can be varied in order to attain the desired performance attributes. This allows for greater flexibility in optimizing performance properties. Preferably, the total amount of attached organic groups is from about 0.001 to about 10.0 micromoles of organic group/$m^2$ surface area of pigment, as measured by nitrogen adsorption (BET method). More preferably, the amount of attached organic groups is between from about 0.01 to about 5.0 micromoles/$m^2$ and most preferably is between from about 0.05 to 3.0 micromoles/$m^2$. In addition, the modified pigments may further comprise additional attached organic groups. This can result in further improved properties. However, when additional attached groups are present, these are also non-polymeric groups.

In addition, mixtures of modified pigments can be used. Thus, the curable coating composition may comprise two or more modified pigments, wherein each of the modified pigments has an attached organic group having the formula —X—I or —X—NI. The two modified pigments should differ in the type of attached group, the amount of attached group, the type of pigment, or combinations thereof. Thus, for example, two modified pigments, each having an attached organic group comprising different groups I (such as one having an attached organic group comprising at least one carboxylic acid group or salt thereof and one having an attached organic group comprising at least one sulfonic acid group or salt thereof) may be used together. Also, two modified pigments, each comprising a different pigment (such as two carbon blacks each having different surface areas and/or structures) and having the same attached organic group (such as one comprising at least one carboxylic acid group) may be used together. In addition, a modified pigment having an attached organic group having the formula —X—I may be used in combination with a modified pigment having an attached organic group having the formula —X—NI. Other combinations of modified pigments having attached —X—I and —X—NI groups can be used. None of the modified pigments used in combination comprise polymeric groups.

The modified pigment used in the curable coating composition of the present invention may also comprise the reaction product of a pigment and a persulfate reagent. The pigment may be any of those described above, and the persulfate reagent is preferably a persulfate salt such as ammonium persulfate, sodium persulfate, or potassium persulfate. The reaction product may be prepared by any method known in the art but is preferably prepared by a method comprising the steps of i) combining the pigment, persulfate reagent, and an aqueous medium (such as water or a mixture of water and at least one water soluble solvent containing greater than 50% water), optionally with an additional strong acid and/or a surfactant or dispersant (such as an anionic or nonionic stabilizer) to form a mixture; ii) heating the mixture; and iii) neutralizing the mixture to a pH greater than 7.0. The heating step preferably occurs below 100° C., such as between about 40° C. and about 90° C. and preferably for a duration of less than 24 hours, such as between about 2 hours and 24 hours. The method may further comprise the step of heating after neutralizing the mixture, which preferably occurs at temperatures higher than the first heating step, such as 20° C. to 40° C. higher, and preferably for a duration between about 2 and 12 hours. Preferably the modified pigment is prepared by a process described in U.S. Patent Publication No. 2004-0103822, which is incorporated in its entirety by reference herein.

The curable coating composition may be formed using any method known to those skilled in the art, including, for example, using high shear mixing. Furthermore, the compositions may be prepared using a dispersion of the modified pigment, such as a millbase. The amount of modified pigment can be between about 1% and 60% based on the total weight of dispersion, and is preferably between about 5% to 30% by weight. More preferably, the amount of modified pigment is such that, when the coating composition is used to form a curable coating and subsequently cured, the resulting coating comprises greater than or equal to about 30 wt % of the modified pigment based on the total weight of the coating. Preferably, the resulting coating comprises greater than or equal to about 50 wt % of the modified pigment based on the total weight of the coating and more preferably comprises between about 50 wt % and 80 wt % of the modified pigment based on the total weight of the coating.

The curable coating composition can be formed with a minimum of additional components (additives and/or cosolvents) and processing steps. However, additives such as surfactants and cosolvents may also be included. For example, when a photosensitive resin is used, such as epoxy bisphenol-A or epoxy novolak, a photoinitiator can also be added. Monomers and/or oligomers may also be added.

The present invention further relates to a curable coating. Preferably, the curable coating is prepared from the curable coating composition of the present invention, which is described in more detail above. The curable coating comprises a curable resin and at least one modified pigment, preferably wherein the modified pigment comprises a pigment having attached at least one organic group having the formula —X—I or X—NI. The curable resin and the modified pigment can be any of those described in more detail above. The curable coating can be a photosensitive coating, resulting in the formation of a coating by irradiating the curable coating, or a thermosensitive coating, in which a coating is formed by thermal treatment of the curable coating. For this aspect of the present invention, the curable coating comprises a sufficient amount of modified pigment such that, when cured to form a coating, the resulting coating comprises greater than or equal to about 30 wt %, preferably greater than or equal to 50 wt %, and more preferably between about 50 wt % and about 80 wt %, of the modified pigment based on the total weight of the coating.

The present invention further relates to a coating. Preferably, the coating is prepared from the curable coating of the present invention, which is described in more detail above. In one embodiment, the coating comprises a resin and at least one modified pigment, wherein the modified pigment is any of those described in more detail above. The modified pigment is present in an amount of greater than or equal to about 30 wt %, preferably greater than or equal to 50 wt %, and more preferably between about 50 wt % and about 80 wt %, of the modified pigment based on the total weight of the coating.

It has surprisingly been found that the curable coating compositions and curable coatings of the present invention may be used to prepare cured coatings that comprise pigments at relatively high levels, such as those described above, compared to levels found in conventional coatings. Also, since the attached organic group is non-polymeric, the percent carbon content (by weight) of the pigment used in the coating may also be much higher (generally about 97% carbon) compared to coatings prepared with pigments having attached polymeric groups or coated with polymers. This enables the preparation of coatings and black matrixes, described in more detail below, having improved overall properties, including improved balance of electrical properties, such as volume resistivity, and optical density. Volume resistivity is a measure of the ability of a material to prevent the conduction of electricity and can be measured using a variety of techniques known in the art including, for example, the method defied in ASTM procedure D257-93. Optical density (OD) is a measure of the opacity of a material and is typically measured using a densitometer. OD is dependent on several factors, including the thickness of the film. The coating of the present invention can have a volume resistivity of greater than or equal to $10^{12}$ ohm-cm, preferably $10^{13}$ ohm-cm and further may have an optical density of greater than or equal to 3, preferably greater than or equal to 4, and more preferably greater than or equal to 5, at a 1 micron thickness. Also, the coating of the present invention can have a volume resistivity of between $10^6$ and $10^8$ ohm-cm and may further have an optical density of greater than or equal to 4, more preferably between 4 and 5, at a 1 micron thickness. The coatings of the present invention may also have similar electrical properties (such as resistivity) at greater film thicknesses, including, for example, 10-100 micron thickness, depending on the application of the coating.

Performance will depend on a variety of factors which may be controlled in accordance with certain embodiments of the present invention, including treatment level and pigment type. For example, it has surprisingly been found that coatings comprising a resin and at least one modified pigment, which comprises a pigment having attached at least one organic group, have improved electrical properties compared to coatings comprising the same resin and the same pigment, without the attached organic group. This is shown in general in FIG. 1 and more specifically in FIGS. 2-4. Each of these is discussed in more detail below.

In general, the loading level of a specific carbon black effects the surface resistivity of a coating containing that carbon black. Initially, at low loadings, the surface resistivity remains substantially constant with increasing amounts of carbon black. At higher levels, a transition occurs in which enough pigment is present that a substantial decrease in resistivity occurs. This is often referred to as the percolation threshold. Levels of pigment in excess of this threshold have very little effect on the resistivity of the coating. In general, most carbon blacks exhibit similar percolation performance. Thus, carbon black percolation curves are very similar, regardless of the type of carbon black, with the exception that the percolation point (i.e., the loading of carbon black in which the surface resistivity decreases) is different. This is shown by a shifting of the percolation curve.

FIG. 1 shows representative percolation curves for three types of coatings. For the purposes of this representation, each coating comprises the same resin but a different carbon black. The carbon black represented by percolation curve C, which is representative of the present invention, is a modified carbon black pigment having attached at least one organic group. The carbon blacks represented by percolation curves A and B are carbon black pigments that have not been modified to have an attached organic group. Also shown is a preselected target surface resistivity and preselected target loading level (wt % C) desired for a coating.

The carbon black represented by curve A does not produce a coating having the targeted resistivity at any carbon black loading levels. In order to produce a coating having this targeted resistivity, a different carbon black would be needed. Typically, in the art, this is accomplished using a carbon black that has a different morphology than that of the carbon black of curve A. Thus, for example, a carbon black having a structure (DBP) that is different from that represented by curve A would have to be found in order to produce a coating having the targeted performance. This is shown by curve B. As shown in FIG. 1, curve B is similar to curve A but is shifted such that that higher levels (wt % C) of the carbon black of curve B are needed to produce coatings having the targeted surface resistivity. As shown, while the carbon black of curve B does produce a coating having the targeted performance, choosing an alternative carbon black having a different morphology may have several disadvantages, including, for example, cost, processing effects, and the like.

Furthermore, as shown in FIG. 1, the target surface resistivity may fall on the steepest point of the percolation curve. From a practical perspective, manufacturing this coating would require tight controls on the carbon black loading since small changes in loading would have a large effect on the observed resistivity. This is generally true for carbon black-containing coatings, which typically have a surface resistivity between about $10^5$ and $10^{12}$ ohm/square.

In order to produce a coating having the preselected performance shown in FIG. 1 without changing morphology, an alternative approach is needed. In the present invention, it has surprisingly been found that the resistivity of a coating can be improved if the coating comprises at least one modified pigment comprising a pigment having attached at least one organic group. It has also been found that coatings having a preselected surface resistivity can be produced using a carbon black that would not have otherwise produced the desired performance. This is shown by curve C, which represents a modified carbon black pigment, wherein the carbon black pigment that has been modified is the carbon black represented by curve A. The unmodified carbon black of curve A, as discussed above, does not meet the preselected resistivity performance. However, the carbon black of curve A modified to have attached at least one organic group, shown by curve C, would produce a coating having the desired performance.

Thus, the resistivity of a coating comprising a modified carbon black pigment has been found to be higher than the resistivity of coatings containing the same but unmodified pigment. As shown by the representative percolation curves in FIG. 1, the resistivity of a film containing a given carbon black can be increased by changing the surface chemistry of that carbon black, in accordance with the present invention. The percolation curve for a given carbon black can also be changed through surface chemistry in accordance with the invention. It has surprisingly been found that resistivity increases with treatment level in general, particularly at higher loading levels. As a result, through the use of the present invention, the percolation curve may be shifted such that a preselected resistivity may occur away from the steepest part of the curve. Thus, small changes in loading do not have a large effect on resistivity.

Thus, it has been found that a preselected or desired target resistivity, particularly at a target loading, can be attained using a modified pigment. The modified pigment comprises a pigment having attached at least one organic group, and this pigment may be a pigment that could not have previously been used to produce a coating having the preselected resistivity, particularly at a specified loading. Additionally, changing morphology may provide optimized coating properties.

Figure 2:
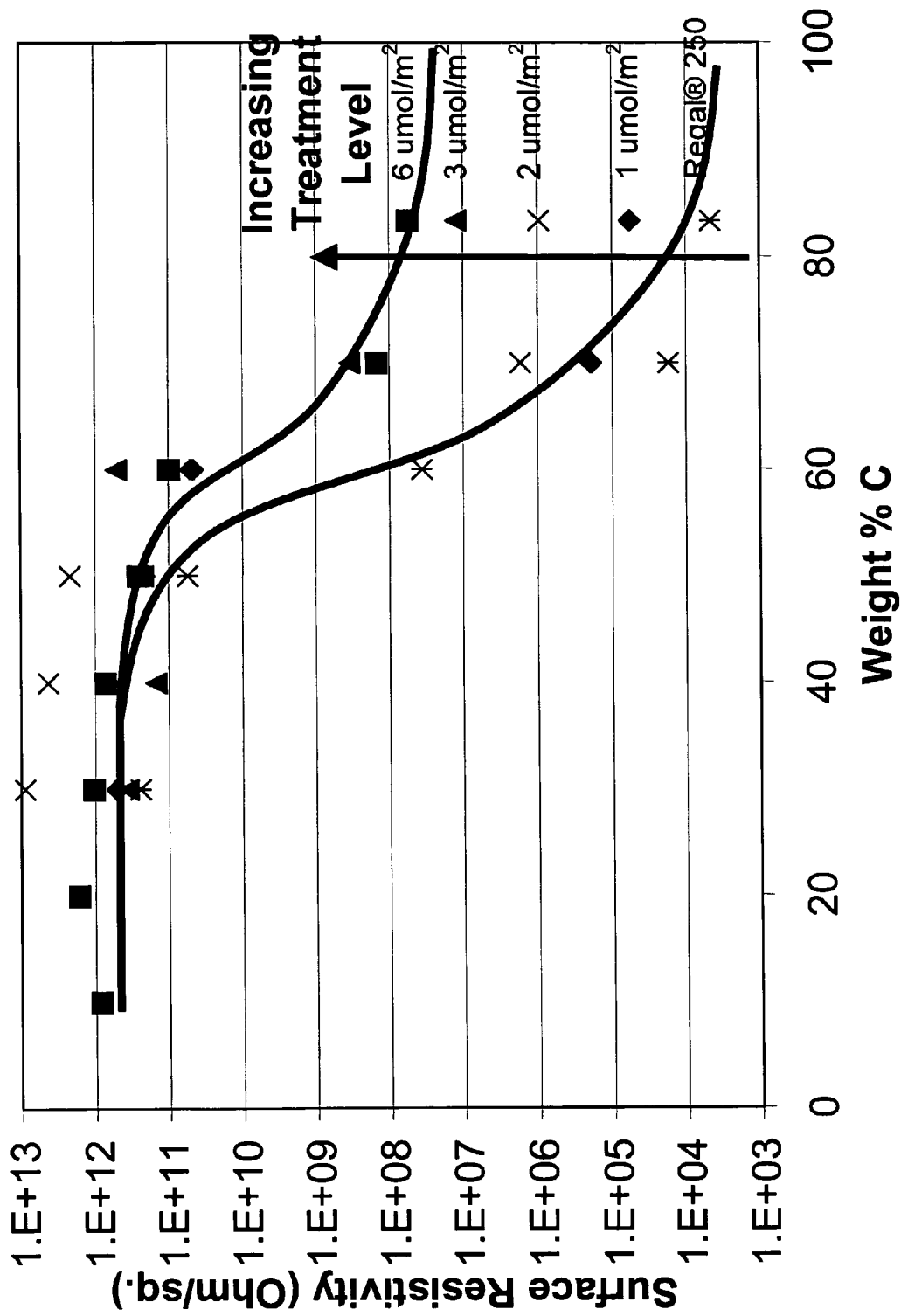
FIG. 2, FIG. 3, and FIG. 4 are graphs which show the surface resistivity of coatings versus various features of the modified pigments. Different organic groups are shown in FIG. 3.
Figure 3:
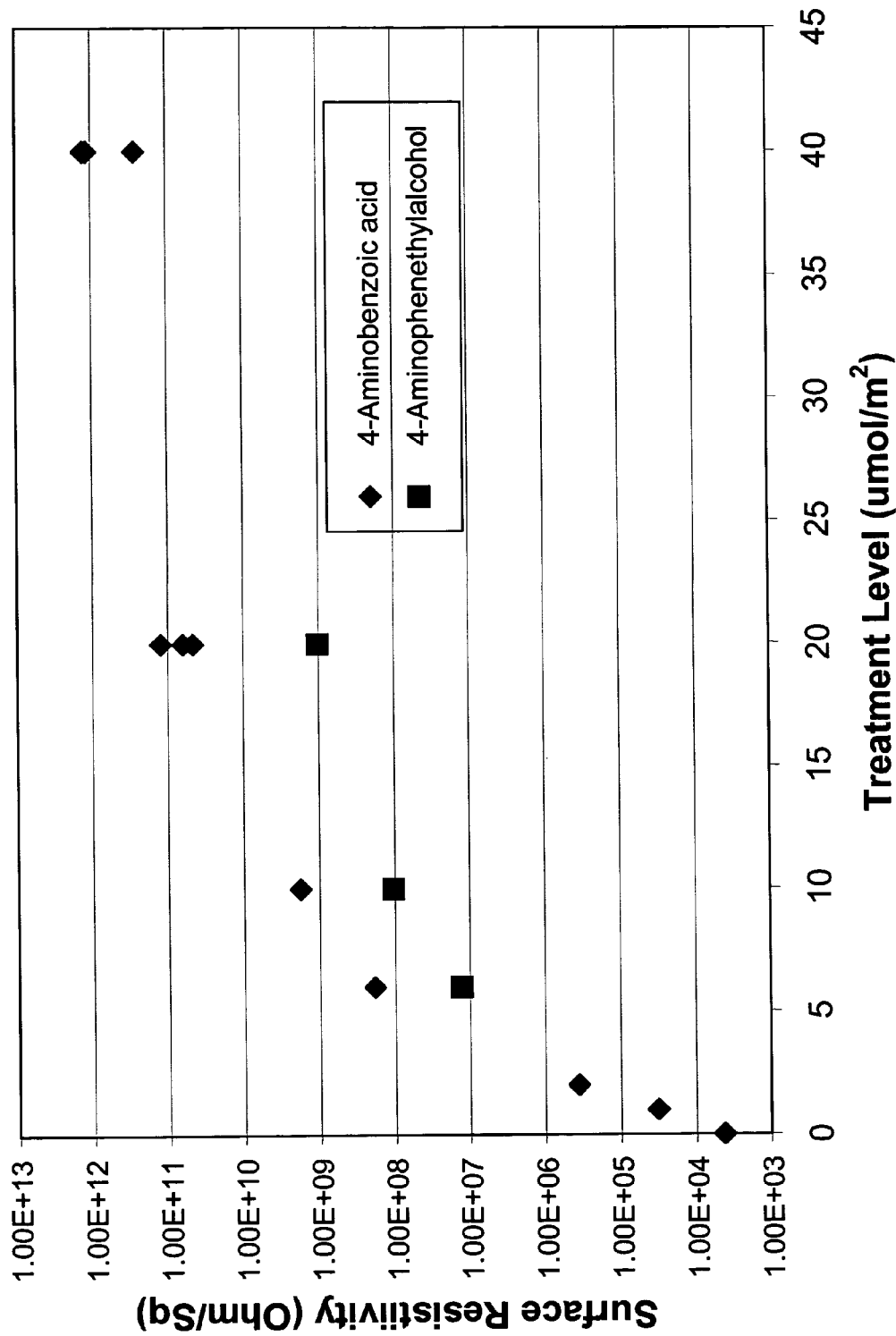
Figure 4:
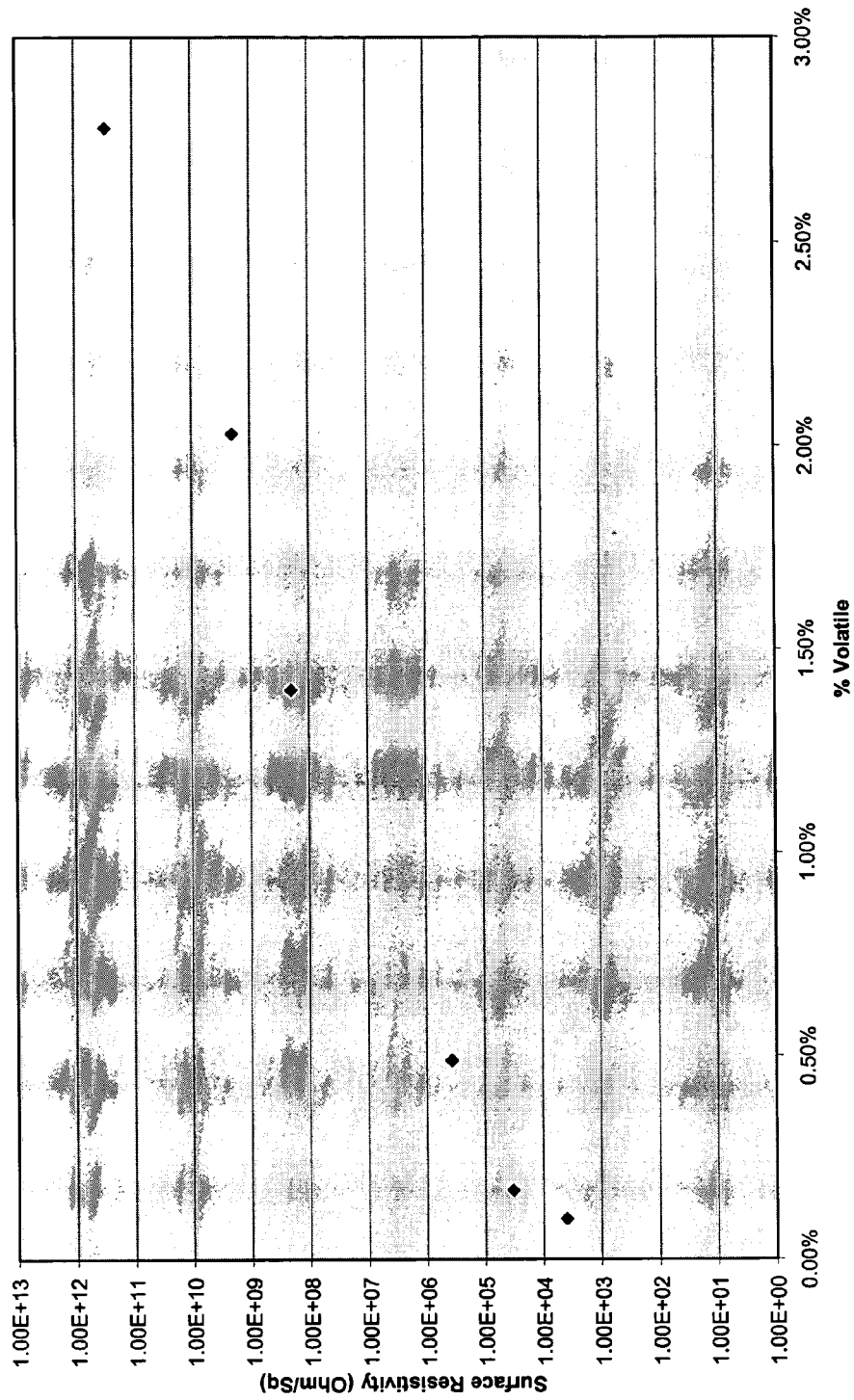

Additionally, it has been found that the amount of attached organic groups can be varied in order to attain the desired performance. This is shown in FIGS. 2-4. FIG. 2 shows the effect of treatment level (i.e., the amount of reagent added to prepare the modified pigment) on the surface resistivity of coatings comprising a resin (Joncryl 611) at various levels of the modified pigment comprising a pigment (Regal® 250 carbon black) having attached at least one organic group ($-C_6H_4-SO_3Na$). As can be seen in FIG. 2, in general, as the treatment level increases, the surface resistivity increases. The effect is more clearly seen at the higher loading levels, particularly above the percolation threshold, especially a coating comprising 83.3 wt % carbon, which corresponds to the millbase. Furthermore, coatings prepared using a modified carbon black at higher loading levels may have resistivities similar to those prepared using an unmodified carbon black at significantly lower loadings. FIG. 3 shows the resistivity of coatings prepared from millbases comprising a modified pigment which is a pigment (Regal® 250 carbon black) having attached at least one organic group (either a $-C_6H_4-CO_2Na$ group or a $-C_6H_4-CH_2CH_2OH$ group). In FIG. 3, the loading level of carbon black is 83.3 weight %, and, as can be seen, increasing the treatment level increases the resistivity of the coating. FIG. 4 shows the same coatings as in FIG. 3 (with the modified pigment comprising a pigment having attached at least one $-C_6H_4-CO_2Na$ group), in which the amount of attached groups has been measured by TGA. As FIG. 4 shows, as the amount of attached groups (attachment level) increases, as represented by the measured volatile content, surface resistivity increases. It has surprisingly been found that surface resistivity can be changed 8 orders of magnitude by changing the amount of attached groups, and that a surface resistivity as high as at least $10^{12}$ ohm/square can be achieved using a pigment having a volatile content of less than 3%.

Thus, FIG. 1-4 exemplify an embodiment of the present invention, which is a method of controlling the resistivity of a coating comprising a resin and a pigment. The method comprises the step of preparing a curable coating composition comprising a vehicle, a curable resin, and at least one modified pigment. The modified pigment comprises the pigment having attached at least one organic group having the formula —X—I or —X—NI, wherein X, which is directly attached to the pigment, represents an arylene or heteroarylene group, an alkylene group, an aralkylene group, or an alkarylene group, I represents a non-polymeric group comprising at least one ionic group or at least one ionizable group, and NI represent a non-polymeric group comprising at least one nonionic group. The curable coating composition can then be applied to a substrate to form a curable coating and cured to form the coating. These figures also show an embodiment of the coating of the present invention, having a preselected resistivity at a preselected pigment loading level comprising a resin and a modified pigment as described above. A coating comprising the resin and said pigment, used to prepare the modified pigment, has a resistivity at the preselected pigment loading level that is lower than the resistivity of the coating comprising the resin and the modified pigment at said preselected pigment loading level.

FIG. 4 further exemplifies an embodiment of the coating of the present invention which comprises a resin and a modified pigment described above. The modified pigment has a volatile content of less than 3%, preferably between about 0.5% and about 3%, and the coating has a resistivity of between $10^6$ and $10^{13}$ ohm/square. Preferably the modified pigment has a volatile content of between about 1.0% and about 3.0%, and the coating has a resistivity of between $10^8$ and $10^{13}$ ohm/square. Thus, it has surprisingly been found that coating compositions having high resistivity (such as greater than $10^8$ ohm/square, preferably greater than $10^{10}$ ohm/square) can be produced using a pigment having a low volatile content, such as less than 3%.

The present invention further relates to a black matrix which may be used in, for example, for a color filter in a liquid crystal display device. The black matrix can be formed using any method known in the art. For example, the black matrix may be formed by applying a curable coating composition comprising a modified carbon product onto a substrate, curing the resulting curable coating imagewise, and developing and drying the cured coating. Preferably, the black matrix is prepared from the curable coating composition, curable coating, and/or the coating of the present invention, each of which is described in more detail above.

Volume resistivity and optical density are important properties for black matrix materials, and are described in more detail above. Since the black matrixes of the present invention are preferably formed from the curable coating compositions of the present invention, which is used to form a cured coating of the present invention, the black matrix can have the performance properties (volume resistivity and optical density) described above in relationship to the coating. In addition, the amount of the attached organic groups of the modified carbon product in the black matrixes of the present invention can be varied in order to attain different desired overall performance attributes. Furthermore, the amount of modified carbon product can be varied and will depend on the type of carbon product and the amount of attached groups. The amount of modified carbon product in the black matrix of the present invention is greater than or equal to 30 wt %, preferably greater than or equal to 50 wt %, and more preferably between about 50 wt % and 80 wt %.

The present invention further relates to a color filter which can be used in combination with a black matrix and, in particular, the black matrix of the present invention. The color filter may be formed using any method known in the art and, in particular using a method similar to that for the black matrix described above. For this application, modified pigments would be used which correspond in color to the colors needed for the pixels of the display device.

The present invention will be further clarified by the following examples which are intended to be only exemplary in nature.

EXAMPLES

Example 1

Preparation of a Modified Pigment 550 g of Regal® 250R carbon black (commercially available from Cabot Corporation), 31.5 g of sulfanilic acid, and 1000 grams of DI water were added to a plow mixer that was jacket-heated to 60° C. A solution of 12.6 g of sodium nitrite in 100 g of DI water was prepared, and this was added to the mixture in the plow mixer. The reaction mixture was mixed at approximately 50 rpm at 60° C. for 2 hours and then allowed to cool down to room temperature. The resulting dispersion of carbon black was diluted to 15% solids and processed by diafiltration with DI water make-up for 7 volumes. The final dispersion was dried in a 75° C. oven overnight and then ground using a lab blender to produce a powder of a modified pigment having attached benzenesulfonic acid groups.

Examples 2A and 2B

Preparation of Millbase

Millbases were prepared using the modified carbon black of Example 1 (Example 2A) and Regal® 250R carbon black (Example 2B). The materials and the amounts used are shown in Table 1. Solsperse 32500 is a polymeric dispersant commercially available from Noveon. The components were milled using a Skandex lab shaker for 2 hours. The mean volume particle size of the pigments in the millbases were measured and found to be comparable to the aggregate size of base carbon black.

TABLE 1

| | Millbase | |
|---|---|---|
| | Example 2A | Example 2B |
| Pigment | Example 1 | Regal ® 250R |
| Amount of pigment | 15 g | 15 g |
| Dispersant | Solsperse 32500 | Solsperse 32500 |
| Amount of dispersant | 7.5 g | 7.5 g |
| PGMEA | 52.5 g | 52.5 g |

Examples 3

Preparation of Letdowns

Each of the millbases of Example 2 were letdown with a 20 wt % solution of Joncryl 611 (commercially available from Johnson Polymers) in PGMEA to prepare coating compositions containing 30%, 40%, 50%, 60%, 70% carbon black by weight on a solvent-free basis. These are very high levels compared to conventional coating compositions. The compositions are shown in Table 2 below.

TABLE 2

Coating Compositions

| Example # | Millbase | Amount of pigment |
|---|---|---|
| Ex 3A-1 | Ex 2A | 30% |
| Ex 3B-1 | Ex 2B | 30% |
| Ex 3A-2 | Ex 2A | 40% |
| Ex 3B-2 | Ex 2B | 40% |
| Ex 3A-3 | Ex 2A | 50% |
| Ex 3B-3 | Ex 2B | 50% |
| Ex 3A-4 | Ex 2A | 60% |
| Ex 3B-4 | Ex 2B | 60% |
| Ex 3A-5 | Ex 2A | 70% |
| Ex 3B-5 | Ex 2B | 70% |

Example 4

Preparation of Coatings

The coating compositions of Example 3 were spin coated onto glass wafers to form coatings, and properties of these coatings were measured. Optical density was measured using a X-Rite 361T Transmission Densitometer, and the thickness was measured using a KLA Tencor Alpha Step 500 Surface Profilometer. The surface resistivity of the coatings was measured using a Keithley Model 6517 Electrometer/High Resistance Meter.

Performance properties of each of the coatings are shown in Tables 3 and 4 below.

TABLE 3

Electrical properties

| Example # | Surface resistivity ($\Omega$/square) |
|---|---|
| Ex 3A-1 | $1.04 \times 10^{12}$ |
| Ex 3B-1 | $2.45 \times 10^{11}$ |
| Ex 3A-2 | $7.17 \times 10^{11}$ |
| Ex 3B-2 | $6.97 \times 10^{11}$ |
| Ex 3A-3 | $2.59 \times 10^{11}$ |
| Ex 3B-3 | $5.58 \times 10^{10}$ |
| Ex 3A-4 | $9.80 \times 10^{10}$ |
| Ex 3B-4 | $3.6 \times 10^{7}$ |
| Ex 3A-5 | $1.47 \times 10^{8}$ |
| Ex 3B-5 | $1.72 \times 10^{5}$ |

TABLE 4

Optical properties

| Example # | OD (1µ thickness) |
|---|---|
| Ex 3A-1 | 1.75 |
| Ex 3B-1 | 1.84 |
| Ex 3A-2 | 2.43 |
| Ex 3B-2 | 2.57 |
| Ex 3A-3 | 3.17 |
| Ex 3B-3 | 3.29 |
| Ex 3A-4 | 3.52 |
| Ex 3B-4 | 4.21 |
| Ex 3A-5 | 4.48 |
| Ex 3B-5 | 4.90 |

These results show that coatings comprising modified pigments as described herein have higher surface resistivity compared to those using conventional pigments. These coatings also maintain a high optical density. It would be expected that these coatings would also have higher volume resistivity compared to coatings comprising conventional pigments at the same coating thickness.

While these examples use a resin that is not curable, it would be expected that similar performance would result if a curable resin, such as a photosensitive or thermosensitive resin, were used. Therefore, these coatings could be used as a black matrix.

Example 5

Preparation of a Coating

A coating was prepared using a procedure similar to that described in Example 4 but using a composition prepared by milling a combination of the modified pigment of Example 1 (6 g), 30.8 g of 20% solution of Joncryl 611 in PGMEA, and 23.2 g of PGMEA in a paint shaker for 8 hours. The resulting coating, having 50% by weight pigment, was found to have an optical density of 3.0 at 1µ thickness. Volume resistivity was found to be $1.8 \times 10^{14}$ ohm-cm.

Properties of this coating can be compared with those of similar coatings (50% CB) obtained using modified pigments comprising the same base pigment but having attached polymeric groups, and mixed with Joncryl 611 in PGMEA (described in Proceedings of IDW'02, #FMC4-2, p. 425 by E. Step). These coatings were found to have an optical density of 3.0 at 1µ thickness and a volume resistivity of $7.0 \times 10^{13}$ ohm cm. Therefore, a coating comprising a modified pigment as described herein has better resistivity properties while maintaining optical density compared to a modified pigment comprising attached polymeric groups.

Examples 6-8

Preparation of Coatings

Modified pigments were prepared using the procedure described in Example 1, with different amounts of sulfanilic acid and the same ratio of sodium nitrite to sulfanilic acid. Millbases were then prepared using these modified pigments, following the procedure described for Examples 2A and 2B, which were then letdown using the procedure described for Example 3 to prepare coating compositions containing various loadings of carbon black. The treatment levels used for each example, calculated from the amount of sulfanilic acid and the surface area of the carbon black (Regal® 250R carbon black), are shown in Table 5 below, which also includes the treatment levels of the pigments used for Examples 3A and 3B. The compositions are shown in Table 6 below, along with those of Examples 3A and 3B.

TABLE 5

Treatment Levels

| Example # | Pigment Treatment Level |
|---|---|
| Ex 3A | 6 µmoles/m² |
| Ex 6 | 3 µmoles/m² |
| Ex 7 | 2 µmoles/m² |
| Ex 8 | 1 µmoles/m² |
| Ex 3B | 0 µmoles/m² |

Coatings were then prepared using the procedure described in Example 4, and the surface resistivity of each coating was measured. The coatings comprising 83.3 wt % carbon correspond to the millbases. Results are shown in Table 6 below. This is also shown graphically in FIG. 2.

TABLE 6

Surface Resistivities (Ω/square)

| % Pigment | Ex 3A | Ex 6 | Ex 7 | Ex 8 | Ex 3B |
|---|---|---|---|---|---|
| 10 | $8.35 \times 10^{11}$ | | | | |
| 20 | $1.67 \times 10^{12}$ | | | | |
| 30 | $1.04 \times 10^{12}$ | $3.58 \times 10^{11}$ | $8.84 \times 10^{12}$ | $5.05 \times 10^{11}$ | $2.45 \times 10^{11}$ |
| 40 | $7.17 \times 10^{11}$ | $1.49 \times 10^{11}$ | $4.24 \times 10^{12}$ | $6.42 \times 10^{11}$ | $6.97 \times 10^{11}$ |
| 50 | $2.59 \times 10^{11}$ | $2.23 \times 10^{11}$ | $2.17 \times 10^{12}$ | $2.16 \times 10^{11}$ | $5.58 \times 10^{10}$ |
| 60 | $9.8 \times 10^{10}$ | $5.08 \times 10^{11}$ | $6.92 \times 10^{10}$ | $4.69 \times 10^{10}$ | $3.61 \times 10^{7}$ |
| 70 | $1.47 \times 10^{8}$ | $3.40 \times 10^{8}$ | $1.67 \times 10^{6}$ | $1.89 \times 10^{5}$ | $1.72 \times 10^{4}$ |
| 83.3 | $5.53 \times 10^{7}$ | $1.23 \times 10^{7}$ | $9.47 \times 10^{5}$ | $5.70 \times 10^{4}$ | $4.59 \times 10^{3}$ |

These results show that, for coatings prepared from the coating compositions of the present invention comprising modified pigments, treatment level effects resistivity. In general, as the treatment level increases, the surface resistivity increases. This effect is more clearly seen at the higher loading levels. Furthermore, coatings prepared using a modified carbon black at higher loading levels may have resistivities similar to those prepared using an unmodified carbon black at significantly lower loadings. It would be expected that similar trends would be seen comparing volume resistivity at equivalent coating thickness.

While these examples use a resin that is not curable, it would be expected that similar performance would result if a curable resin, such as a photosensitive or thermosensitive resin, were used. Therefore, these coatings could be used as a black matrix.

Example 9

Coatings were prepared from millbases, which were prepared using the procedure similar to that described in Examples 6-8. These coatings comprise 83.3 wt % carbon black. Example 9A is a comparison coating comprising a conventional carbon black. Examples 9B-9F are coatings of the present invention comprising modified carbon blacks. For Examples 9A-9F, the modified carbon blacks were prepared using a procedure similar to that described in Example 1, except using 4-aminobenzoic acid (PABA) instead of sulfanilic acid, and using a smaller scale mixer rather than the plow mixer. The amount of PABA used for each of these examples correspond to the treatment levels (added levels of PABA) shown in Table 7 below. Also, for each example, the percent volatiles (total amount of volatiles), measured by TGA, for the carbon blacks used are shown.

TABLE 7

| Example # | Treatment Level (μmoles/m²) | % Volatile | Surface Resistivity (Ω/square) | Film Thickness (μm) |
|---|---|---|---|---|
| 9A | 0 | 0.10% | $4.00 \times 10^{3}$ | 1.065 |
| 9B | 1 | 0.17% | $3.30 \times 10^{4}$ | 0.984 |
| 9C | 2 | 0.49% | $3.70 \times 10^{5}$ | 0.965 |
| 9D | 6 | 1.40% | $2.00 \times 10^{8}$ | 0.936 |
| 9E | 10 | 2.03% | $2.00 \times 10^{9}$ | 0.892 |
| 9F | 40 | 2.78% | $2.92 \times 10^{11}$ | 0.898 |

The surface resistivity and film thickness of each coating was measured as described in Example 4, and these results are also shown in Table 7 above as well as graphically in FIG. 3 (treatment level and surface resistivity) and FIG. 4 (% volatiles and surface resistivity).

Also shown in FIG. 4 are surface resistivity values for coatings prepared using a modified carbon black having attached phenethyl alcohol groups, which were prepared using a procedure similar to that described in Example 1 with the exception that 4-aminophenethyl alcohol was used in place of sulfanilic acid. For coatings containing 6, 10, and 20 μmoles/m² treatment levels of 4-aminophenylethyl alcohol, surface resistivity values of $1.29 \times 10^{7}$, $1.05 \times 10^{8}$, and $1.03 \times 10^{9}$ Ω/square (respectively) were found.

These results show that, for coatings prepared from the coating compositions of the present invention comprising modified pigments, as the treatment level increases, the surface resistivity increases. This effect can be seen for both treatment types. Similar trends are seen comparing % volatile values, which can be considered an indication of attachment level. It has surprisingly been found that a modified pigment having a low volatile content, such as those shown above, can be used to produce a coating having high resistivities. It would be expected that these coatings would also have increasingly higher volume resistivity with increasing treatment level and % volatiles, at the same coating thickness.

While these examples use a resin that is not curable, it would be expected that similar performance would result if a curable resin, such as a photosensitive or thermosensitive resin, were used. Therefore, these coatings could be used as a black matrix.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A black matrix formed by applying a curable coating composition onto a substrate to form a curable coating, curing the curable coating imagewise to form a cured coating, and developing and drying the cured coating, wherein the curable coating composition comprises a vehicle and at least one modified pigment comprising a pigment having attached at least one organic group having the formula —X—I, wherein X, which is directly attached to the pigment, represents an arylene or heteroarylene group, or an alkylene group, and I represents a non-polymeric group comprising at least one ionic group or at least one ionizable group, and wherein the cured coating comprises greater than or equal to about 30 wt % of the modified piggment based on the total weight of the cured coating.

2. The black matrix of claim 1, wherein X represents an arylene or heteroarylene group, or an alkylene group having 12 carbons or less.

3. The black matrix of claim 1, wherein X is an arylene group.

4. The black matrix of claim 1, wherein I comprises at least one carboxylic acid group or salt thereof, at least one sulfonic acid group or salt thereof, at least one alkyl sulfate group, at least one alkyl amine group or salt thereof, or at least one alkyl ammonium group.

5. The black matrix of claim 4, wherein the salt is a $Na^+$ salt, a $K^+$ salt, a $Li^+$ salt, or a $NH_4^+$ salt.

6. The black matrix of claim 1, wherein the organic group is an aryl carboxylic acid salt group or an aryl sulfonic acid salt group.

7. The black matrix of claim 1, wherein the curable coating is a photosensitive coating and the coating is formed by irradiating the curable coating.

8. The black matrix of claim 7, wherein the curable coating composition comprises a photocurable resin and optionally further comprises at least one photoinitiator.

9. The black matrix of claim 1, wherein the curable coating is a thermosensitive coating and the coating is formed by thermal treatment of the curable coating.

10. The black matrix of claim 1, wherein the cured coating comprises greater than or equal to about 50 wt % of the modified pigment based on the total weight of the cured coating.

11. The black matrix of claim 1, wherein the cured coating comprises between about 50 wt % and 80 wt % of the modified pigment based on the total weight of the cured coating.

12. The black matrix of claim 1, wherein the coating has a volume resistivity of greater than or equal to $10^{12}$ ohm-cm.

13. The black matrix of claim 12, wherein the coating further has an optical density of greater than or equal to 3 at a 1 micron thickness.

14. The black matrix of claim 1, wherein the coating has a volume resistivity of between $10^6$ and $10^8$ ohm-cm.

15. The black matrix of claim 14, wherein the coating further has an optical density of greater than or equal to 4 at a 1 micron thickness.

16. The black matrix of claim 1, wherein the vehicle is a non-aqueous vehicle.

17. The black matrix of claim 1, wherein the vehicle comprises propyleneglycol monomethyl ether acetate.

18. The black matrix of claim 1, wherein the vehicle is an aqueous vehicle.

19. The black matrix of claim 1, wherein the curable coating composition comprises at least two modified pigments, wherein the modified pigments are not the same.

20. The black matrix of claim 19, wherein at least one of the modified pigments comprises at least one carboxylic acid group or salt thereof and wherein at least one of the modified pigments comprises at least one sulfonic acid group or salt thereof.

21. The black matrix of claim 1, wherein the modified pigment further has attached at least one organic group having the formula —X—NI, wherein NI represents a non-polymeric group comprising at least one nonionic group.

22. The black matrix of claim 21, wherein the nonionic group is an alkyl group, a carboxylic acid ester, an amide, an alkylene oxide, a glycol, an alcohol, an ether, a ketone, a halogen, or a nitrile.

23. The black matrix of claim 21, wherein the nonionic group is an aryl carboxylic acid ester, an aryl carboxylic acid amide, or an aralkyl group.

24. A black matrix formed by applying a curable coating composition onto a substrate to form a curable coating, curing the curable coating imagewise to form a cured coating, and developing and drying the cured coating, wherein the curable coating composition comprises a vehicle and at least one modified pigment comprising a pigment having attached at least one organic group having the formula —X—NI, wherein X, which is directly attached to the pigment, represents an arylene or heteroarylene group, or an alkylene group, and NI represents a non-polymeric group comprising at least one nonionic group, and wherein the cured coating comprises greater than or equal to about 30 wt % modified pigment based on the total weight of the cured coating.

\* \* \* \* \*